(12) United States Patent
Yao et al.

(10) Patent No.: US 10,504,602 B2
(45) Date of Patent: Dec. 10, 2019

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Xing Yao, Beijing (CN); Seung-Woo Han, Beijing (CN); Guangliang Shang, Beijing (CN); Mingfu Han, Beijing (CN); Haoliang Zheng, Beijing (CN); Yun-Sik Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 77 days.

(21) Appl. No.: 15/840,757

(22) Filed: Dec. 13, 2017

(65) Prior Publication Data
US 2018/0293956 A1 Oct. 11, 2018

(30) Foreign Application Priority Data
Apr. 5, 2017 (CN) .......................... 2017 1 0217820

(51) Int. Cl.
*G11C 19/28* (2006.01)
*G11C 19/18* (2006.01)
*G02F 1/1345* (2006.01)
*G09G 3/20* (2006.01)

(52) U.S. Cl.
CPC ........ *G11C 19/287* (2013.01); *G02F 1/13454* (2013.01); *G09G 3/20* (2013.01); *G11C 19/184* (2013.01); *G09G 2300/0408* (2013.01); *G09G 2300/0426* (2013.01); *G09G 2310/0286* (2013.01); *G09G 2310/08* (2013.01)

(58) Field of Classification Search
CPC ... G09G 2310/0286; G09G 2300/0408; G09G 3/3674; G09G 3/3266; G11C 19/28; G11C 19/287; G02F 1/13454; G02F 3/3674; G02F 3/3266; H01L 27/14609
See application file for complete search history.

(56) References Cited

U.S. PATENT DOCUMENTS

| | | | |
|---|---|---|---|
| 2002/0047822 A1* | 4/2002 | Senda | G09G 3/32 345/90 |
| 2013/0321499 A1* | 12/2013 | Park | G09G 3/20 345/698 |
| 2013/0334543 A1* | 12/2013 | Kim | H01L 33/36 257/79 |
| 2014/0078123 A1* | 3/2014 | Park | G09G 3/20 345/205 |
| 2015/0310821 A1* | 10/2015 | Kim | G09G 3/3677 345/212 |
| 2017/0047038 A1* | 2/2017 | Noma | G02F 1/1368 |
| 2017/0178586 A1* | 6/2017 | Kim | G09G 3/3688 |

* cited by examiner

*Primary Examiner* — Sanjiv D. Patel
(74) *Attorney, Agent, or Firm* — Foley & Lardner LLP; James F. Ewing; Paul M. H. Pua

(57) ABSTRACT

The present disclosure relates to an array substrate, a display panel and a display device. The array substrate includes a plurality of shift register units, a plurality of gate lines and a plurality of data lines crossing the plurality of gate lines. The plurality of gate lines crossing the plurality of data lines defines a plurality of pixel regions. Each of the pixel regions is divided into a driving zone and a pixel unit zone. A plurality of the driving zones in a same column constitute at least one unit region and each of the shift register units is disposed in one of the unit regions to provide scanning signals to the gate line connected thereto.

20 Claims, 4 Drawing Sheets

ARRAY SUBSTRATE, DISPLAY PANEL AND DISPLAY DEVICE

CROSS-REFERENCE TO RELATED APPLICATIONS

The present application claims priority to China Patent Application No. 201710217820.X filed on Apr. 5, 2017, the disclosure of which is incorporated by reference herein in its entirety.

TECHNICAL FIELD

The present disclosure relates to an array substrate, a display panel and a display device.

BACKGROUND

In a traditional display panel using shift registers, the shift registers are located on both sides of the display area. With increase of resolutions and dimensions of display panels, loads of shift registers and dimensions of thin film transistors in circuits of the shift registers increase, enlarging the dimensions of the bezels of the display panels. Furthermore, in such display panels, only one shift register is typically used to drive a whole gate line. This traditional driving scheme with shift registers is not applicable to the new smart-view display.

SUMMARY

In accordance with the first aspect of the present disclosure, an array substrate is provided, which includes a plurality of shift register units, a plurality of gate lines and a plurality of data lines crossing the plurality of gate lines. The plurality of gate lines crossing the plurality of data lines defines a plurality of pixel regions. Each of the pixel regions is divided into a driving zone and a pixel unit zone. A plurality of the driving zones in a same column constitute at least one unit region and each of the shift register units is disposed in one of the unit regions to provide scanning signals to the gate line connected to the shift register unit.

In accordance with the second aspect of the present disclosure, a display panel including the array substrate described above is provided.

In accordance with the third aspect of the present disclosure, a display device including the display panel described above is provided.

BRIEF DESCRIPTION OF THE DRAWINGS

In order to clearly illustrate the technical solutions in some embodiments of the present disclosure, the accompanying drawings for the embodiments will be briefly described in the following; it is to be noted that the drawings to be described in the following are only related to some embodiments of the present disclosure rather than limitative of the present disclosure. In the accompanying drawings.

DETAILED DESCRIPTION

In order to make objects, technical solutions and advantages of some embodiments of the present disclosure clearer, the technical solutions of some embodiments of the present disclosure will be described in a clearly and fully understandable way in connection with the accompanying drawings. It is obvious that the embodiments to be described are only some, not all, of the embodiments of the present disclosure. Based on the described embodiments of the present disclosure, all other embodiments that can be obtained by those skilled in the art without any creative efforts also fall within the protection scope of the present disclosure.

Unless otherwise defined, all the terms (including technical and scientific terms) used herein have the same meanings as those commonly understood by those skilled in the art to which the subject matter of the present disclosure belongs. It is to be further understood that terms such as those defined in common dictionaries should be interpreted to have meanings consistent with the context in the specification and their meanings in related techniques, and should not be interpreted in an idealized or too formal way, unless definitely defined otherwise herein. As used herein, the statement of "connecting" or "coupling" two or more parts together means that those parts are bonded together directly or via one or more intermediate components. In addition, the terms such as "first" and "second" are only used to distinct one component (or a part thereof) from another component (or another part of said one component).

Figure 1:
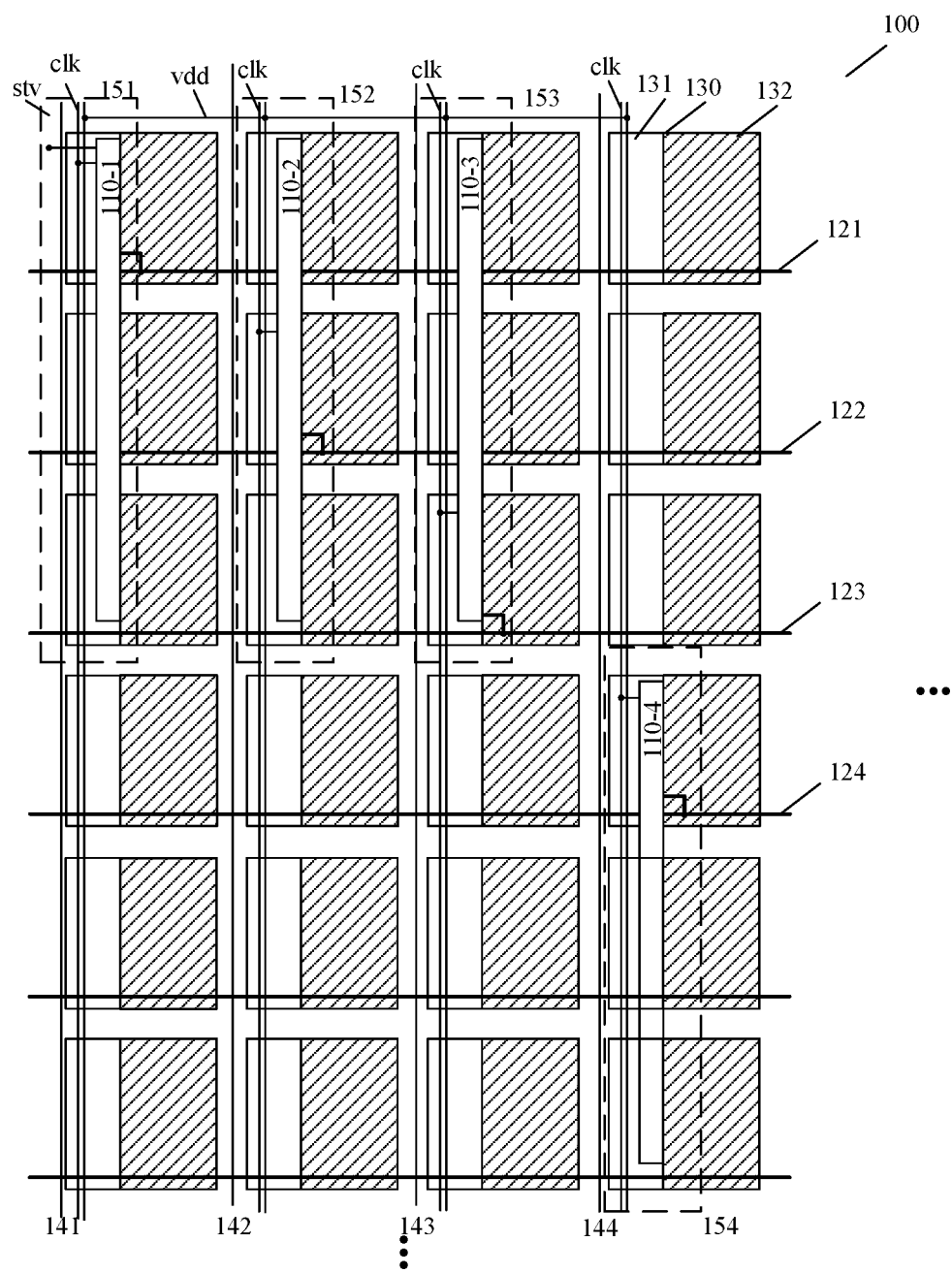
FIG. 1 is a schematic structural diagram of an array substrate in accordance with some exemplary embodiments of the present disclosure.

FIG. 1 illustrates a schematic structural diagram of an array substrate 100 in accordance with some exemplary embodiment of the present disclosure. The array substrate 100 includes a plurality of shift register units (110-1, 110-2, 110-3, 110-4, . . . ), a plurality of gate lines (121, 122, 123, 124, . . . ) and a plurality of data lines (141, 142, 143, 144, . . . ) crossing the plurality of gate lines. The gate lines (121, 122, 123, 124, . . . ) crossing the data lines defines a plurality of pixel regions 130. Each pixel region 130 is divided into a driving zone 131 (denoted by the blank zone in the pixel region 130) and a pixel unit zone 132 (denoted by the shadow zone in the pixel region 130). The pixel unit zone 132 has a pixel unit disposed therein. Each gate line (121, 122, 123, 124, . . . ) is connected with a shift register unit (110-1, 110-2, 110-3, 110-4, . . . ) and controls a row of pixel units correspondingly. A plurality of driving zones 131 located in a same column constitute at least one unit region (151, 152, 153, 154, . . . ) and each shift register unit (110-1, 110-2, 110-3, 110-4, . . . ) is disposed in one unit region (151, 152, 153, 154, . . . ) so as to provide scanning signals to the gate line (121, 122, 123, 124, . . . ) connected with the shift register unit.

A unit region may be constituted by one or more of all the driving zones 131 in one column. For example, as shown in FIG. 1, in the first column, the first to third driving zones 131 from top to bottom may constitute one unit region 151, while the fourth to sixth driving zones 131 may constitute another unit region. The fourth to sixth driving zones 131 in the fourth column may constitute one unit region 154. In some embodiments, a unit region may also be constituted by all the driving zones 131 in one column. What have been described above are only examples, and the number of driving zones contained in a unit region is not limited and may be configured in any other possible way.

In some embodiments, a unit region is configured to have at least an area capable of accommodating the shift register units to be disposed therein. In some embodiments, if a unit region has only one shift register unit disposed therein, the unit region should be configured to have at least an area capable of accommodating one shift register unit (110-1, 110-2, 110-3, 110-4, . . . ).

For example, in some embodiments, the shift register units (110-1, 110-2, 110-3, 110-4, . . . ) are arranged in unit regions (151, 152, 153, 154, . . . ) in different columns. For example, as shown in FIG. 1, the first shift register unit 110-1 is disposed in a unit region 151 in the first column and connected with the first gate line 121 to provide scanning signals to the first gate line 121 so as to control the first row of pixel units. The second shift register unit 110-2 is disposed in a unit region 152 in the second column and connected with the second gate line 122 to provide scanning signals to the second gate line 122 so as to control the second row of pixel units. The third shift register unit 110-3 is disposed in a unit region 153 in the third column and connected with the third gate line 123 to provide scanning signals to the third gate line 123 so as to control the third row of pixel units. The fourth shift register unit 110-4 is disposed in a unit region 154 in the fourth column and connected with the fourth gate line 124 to provide scanning signals to the fourth gate line 124 so as to control the fourth row of pixel units. Other arrangements may be deduced by analogy.

It will be understood by those skilled in the art that, in alternative embodiments, the shift register units (110-1, 110-2, 110-3, 110-4, . . . ) may correspond to the gate lines (121, 122, 123, 124, . . . ) in other relationships. For example, the shift register units from right to left ( . . . , 110-4, 110-3, 110-2, 110-1) correspond respectively to the gate lines from top to bottom (121, 122, 123, 124, . . . ) in this order. The schematic structural diagram shown in FIG. 1 only illustrates one of a plurality of correspondence relationships between the shift register units (110-1, 110-2, 110-3, 110-4, . . . ) and the gate lines (121, 122, 123, 124, . . . ).

Disposing the shift register units in the pixel regions, i.e. in the display area, as compared to disposing the shift register units on both sides of the display area, may reduce the width of the border of an array substrate, thereby facilitating to achieve a display panel with a narrow bezel.

In an example, a driving zone 131 is configured to have an area smaller than that of a pixel unit zone 132. For example, when a pixel includes three sub-pixels, the area of a driving zone 131 is one fourth of that of a pixel region 130. This configuration will not result in a too low aperture opening ratio to affect high resolution display.

Furthermore, in the array substrate 100, power lines vdd for supplying power to the shift register units (110-1, 110-2, 110-3, 110-4, . . . ) and clock signal lines clk for providing clock signals to the shift register units (110-1, 110-2, 110-3, 110-4, . . . ) are disposed in two different layers, with a resin layer being disposed between the two layers to reduce overlapping capacitance. The voltages output from the power lines vdd and the clock signals output from the clock signal lines clk are correspondingly configured in accordance with the specific circuits in the shift register units (110-1, 110-2, 110-3, 110-4, . . . ).

Figure 2:
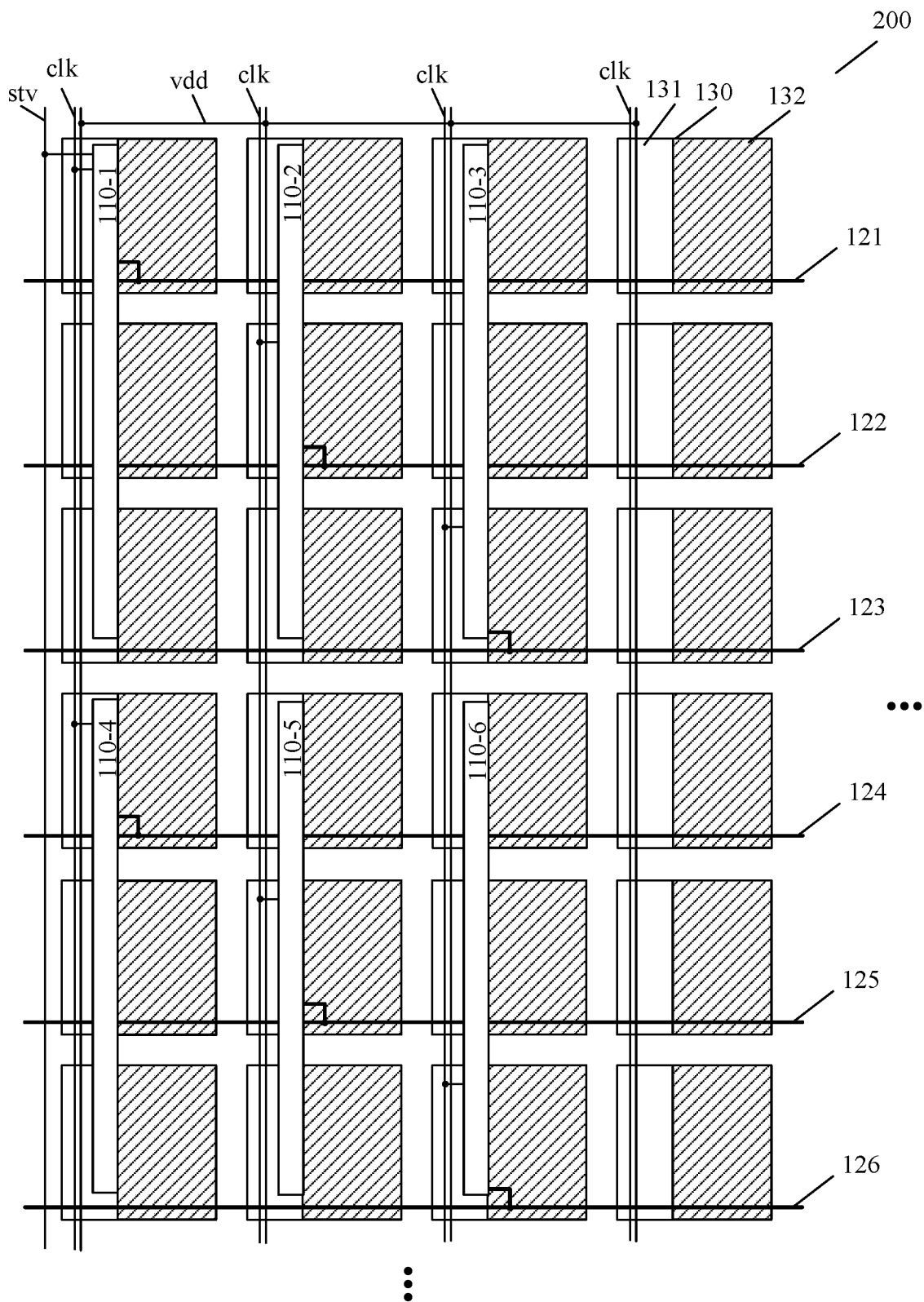
FIG. 2 is a schematic structural diagram of an array substrate in accordance with some other exemplary embodiments of the present disclosure.

FIG. 2 illustrates a schematic structural diagram of an array substrate 200 in accordance with some other exemplary embodiments of the present disclosure. The exemplary embodiment shown in FIG. 2 is different from that shown in FIG. 1 in that, in the exemplary embodiment shown in FIG. 2, at least two shift register units (110-1, 110-2, 110-3, 110-4, . . . ) are disposed in different unit regions in one and the same column. For example, as shown in FIG. 2, the first shift register unit 110-1 is connected with and provides scanning signals to the first gate line 121 so as to control the first row of pixel units. The second shift register unit 110-2 is connected with and provides scanning signals to the second gate line 122 so as to control the second row of pixel units. The third shift register unit 110-3 is connected with and provides scanning signals to the third gate line 123 so as to control the third row of pixel units. The fourth shift register unit 110-4 located in a unit region in the same column as the first shift register unit 110-1 is connected with and provides scanning signals to the fourth gate line 124 so as to control the fourth row of pixel units. The fifth shift register unit 110-5 located in a unit region in the same column as the second shift register unit 110-2 is connected with and provides scanning signals to the fifth gate line 125 so as to control the fifth row of pixel units. The sixth shift register unit 110-6 located in a unit region in the same column as the third shift register unit 110-3 is connected with and provides scanning signals to the sixth gate line 126 so as to control the sixth row of pixel units. Other arrangements may be deduced by analogy.

It should be understood by those skilled in the art that, in alternative embodiments, the shift register units (110-1, 110-2, 110-3, 110-4, . . . ) may correspond to the gate lines (121, 122, 123, 124, . . . ) in other relationships. The schematic structural diagram shown in FIG. 2 only illustrates one of a plurality of correspondence relationships between the shift register units (110-1, 110-2, 110-3, 110-4, . . . ) and the gate lines (121, 122, 123, 124, . . . ).

Figure 3:
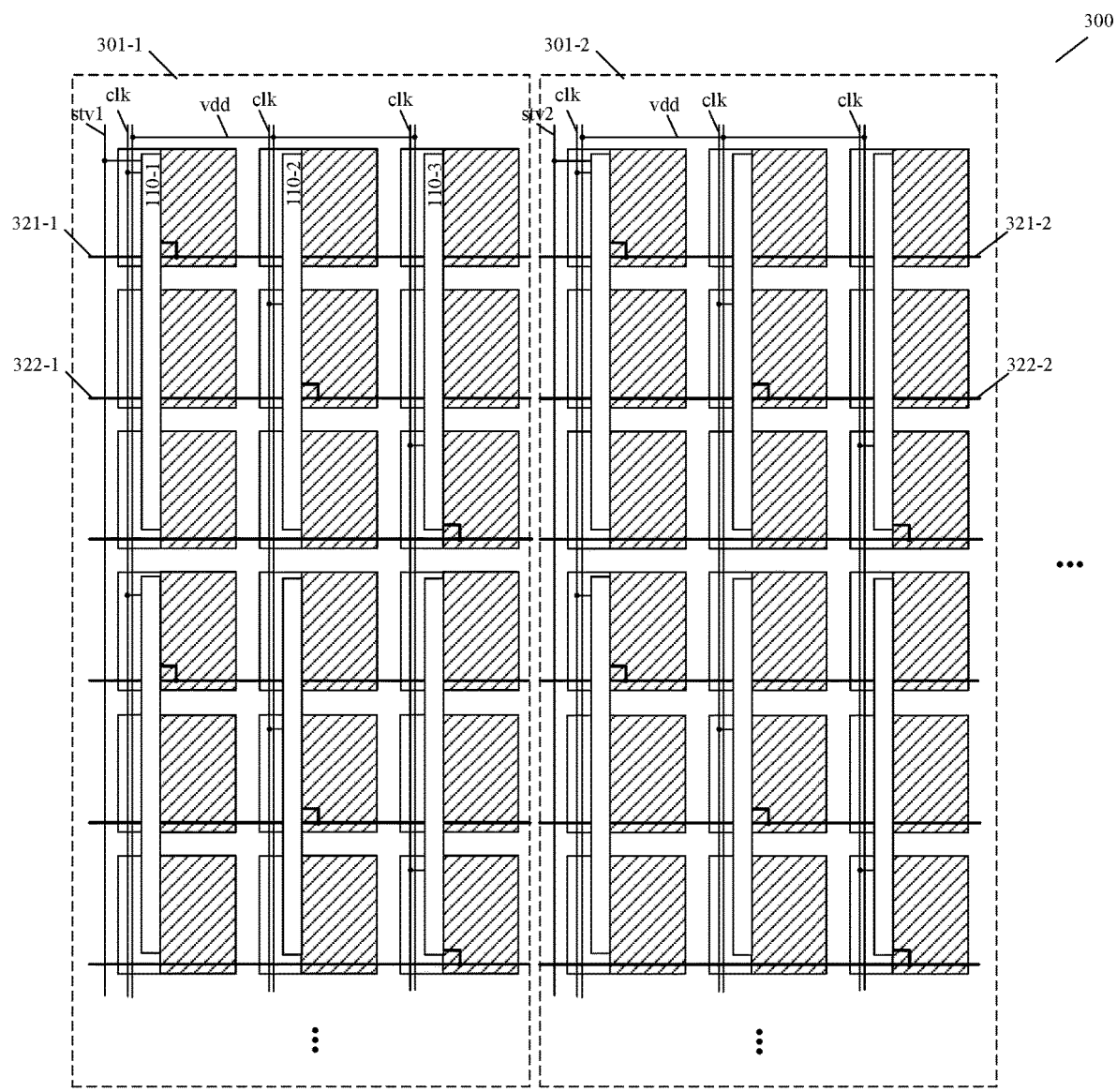
FIG. 3 is a schematic structural diagram of an array substrate in accordance with yet some other exemplary embodiments of the present disclosure.

FIG. 3 illustrates a schematic structural diagram of an array substrate 300 in accordance with yet some other exemplary embodiments. The exemplary embodiment shown in FIG. 3 is different from those shown in FIG. 1 and FIG. 2 in that, in the exemplary embodiment shown in FIG. 3, each gate line is divided into at least two gate line segments (321-1, 321-2, 322-1, 322-2, . . . ). Each gate line segment (321-1, 321-2 ... 322-1, 322-2, . . . ) is connected with and correspondingly controls at least one pixel unit (three pixel units in the example shown in FIG. 3). The display area is divided into at least two sub-display-areas (301-1, 301-2, . . . ) in accordance with the positions at which the gate line segments (321-1, 321-2, ..., 322-1, 322-2, . . . ) are separated, and individual shift register units (110-1, 110-2, 110-3, . . . ) for driving the gate line segments (321-1, 321-2, ..., 322-1, 322-2, . . . ) in one and the same sub-display-area (301-1, 301-2, . . . ) are cascaded together to constitute one shift register.

Each shift register is input an initiating signal by an initiating signal line. Initiating signals input to individual shift registers maybe the same as or different from each other. For example, as shown in FIG. 3, the shift register in the first sub-display-area 301-1 is connected to the first initiating signal line STV1, while the shift register in the second sub-display-area 301-2 is connected to the second initiating signal line STV2. In an example, initiating signals in the same timing sequence are input into the first initiating signal line STV1 and the second initiating signal line STV2 to light the first sub-display-area 301-1 and the second sub-display-area 301-2 simultaneously. In an alternative example, initiating signals in different timing sequences are input into the first initiating signal line STV1 and the second initiating signal line STV2 to light the first sub display area 301-1 and the second sub display area 301-2 at different points of time.

In the exemplary embodiment shown in FIG. 3, since the gate lines each have the same positions at which they are broken and each are divided into gate line segments of equal lengths (321-1, 321-2, ..., 322-1, 322-2, ...), so that the sub-display-areas (301-1, 301-2, ...) formed in accordance with the positions at which the gate line segments (321-1, 321-2, ..., 322-1, 322-2, ...) are separated from each other are rectangular and have equal areas. It should be understood by those skilled in the art that, in some alternative embodiments, when the gate lines each have the same positions at which they are broken, the gate lines may each be divided into gate line segments of unequal lengths (321-1, 321-2, ..., 322-1, 322-2, ...), so that the resulted sub-display-areas (301-1, 301-2, ...) are sill rectangular but may have unequal areas. Furthermore, in another alternative embodiment, the gate lines may each have different positions at which they are broken, so that the resulted sub-display-areas (301-1, 301-2, ...) may not be rectangular and may have unequal areas.

In some embodiments, a gate line is divided into at least two gate line segments and scanning signals for the gate line segments may be different from each other, which is suitable for local presentation required by the new smart-view display; furthermore, the load connected to each of the gate line segments is significantly smaller than that connected to each gate line in related techniques, so that the driving capability of the shift register units may be improved, making the display of the display panel including the array substrate in accordance with the embodiments of the present disclosure more uniform.

Figure 4:
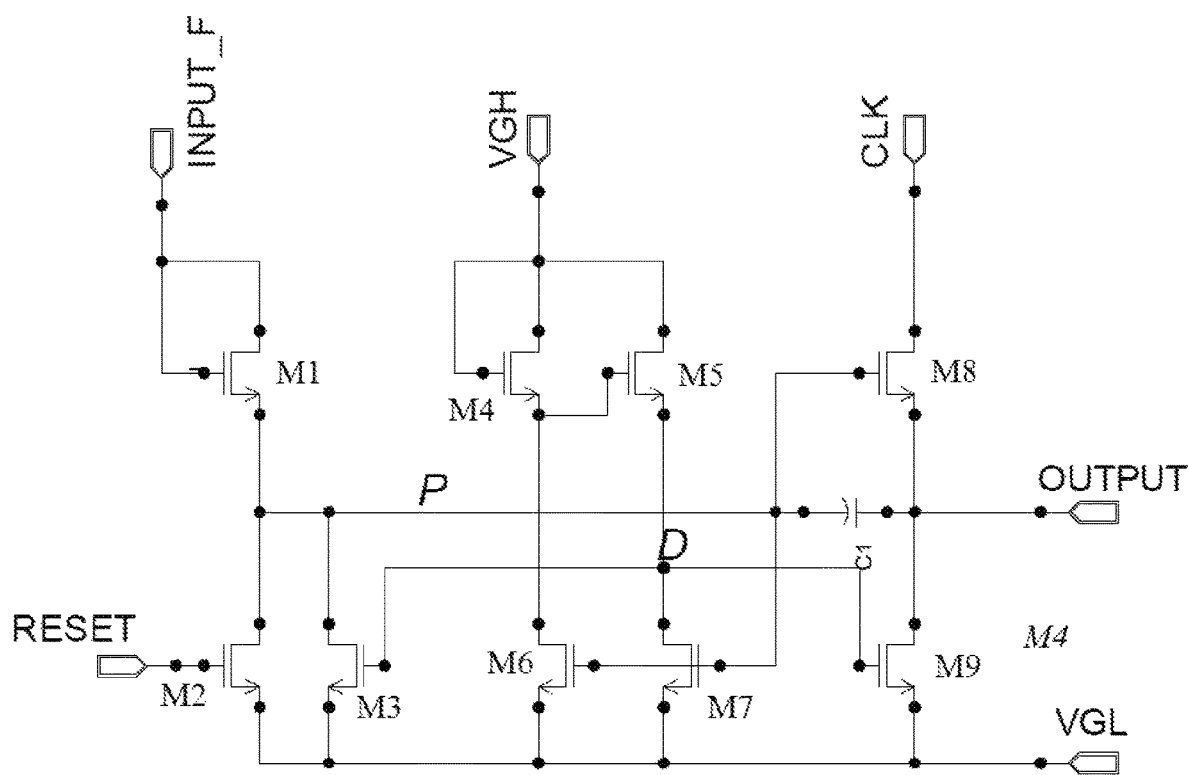
FIG. 4 is a schematic circuit diagram of a shift register unit in accordance with some exemplary embodiments of the present disclosure.

FIG. 4 illustrates a schematic circuit diagram of a shift register unit in accordance with some exemplary embodiments of the present disclosure. It should be understood by those skilled in the art that the circuit structure of the shift register unit shown in FIG. 4 is only an example and should not be considered to limit the present disclosure in any way. That is to say, the protection scope claimed by the present disclosure is not limited by the specific circuit structure of the shift register unit 110.

As shown in FIG. 4, the shift register unit includes first to ninth transistors M1-M9 and a capacitor C1.

The first transistor has its control electrode and its first electrode coupled to an input terminal INPUT and has its second electrode coupled to a first node P. The second transistor M2 has its control electrode coupled to a reset signal terminal RESET, its first electrode coupled to a first level VGL and its second electrode coupled to the first node P. The third transistor M3 has its control electrode coupled to a second node D, its first electrode coupled to the first level VGL and its second electrode coupled to the first node P. The fourth transistor M4 has its control electrode coupled to a second level VGH and its second electrode coupled to the control electrode of the fifth transistor M5 and the second electrode of the sixth transistor M6. The fifth transistor M5 has its first electrode coupled to the second level VGH and its second electrode coupled to the second node D. The sixth transistor M6 has its control electrode coupled to the first node P and its first electrode coupled to the first level VGL. The seventh transistor M7 has its control electrode coupled to the first node P, its first electrode coupled to the first level VGL and its second electrode coupled to the second node D. The eighth transistor M8 has its control electrode coupled to the first node P, its first electrode coupled to a clock signal terminal CLK and its second electrode coupled to an output terminal OUTPUT. The ninth transistor M9 has its control electrode coupled to the second node D, its first electrode coupled to the first level VGL and its second electrode coupled to the output terminal OUTPUT. The capacitor has its first terminal coupled to the first node P and its second terminal coupled to the output terminal OUTPUT.

In accordance with some embodiments of the present disclosure, a display panel is further provided, which includes any of the array substrates in the exemplary embodiments shown in FIGS. 1-3.

In accordance with some embodiments of the present disclosure, a display device is further provided, which includes the display panel described above.

As can be seen from the description above that, in the array substrate, display panel and display device in accordance with embodiments of the present disclosure, the shift register units are disposed in the display area, which can reduce the bezel width of a display panel or a display device and thus facilitates to achieve a display panel or a display device designed with a narrow bezel, in contrast to disposing the shift register units on both sides of the display area.

The display device provided in embodiments of the present disclosure maybe applied to any product with display functionality, such as an electronic paper, a cellphone, a tablet computer, a television set, a notebook computer, a digital picture frame, a navigator, or the like.

As used in the specification and the accompanying claims, a term preceded by a singular article, such as "a", "an" or "the", is intended to also include its plural form and vice versa, unless designated otherwise explicitly in the context. Therefore, when an item is referred to in its singular form, it usually also includes its corresponding plural form. Similarly, items "including" and "comprising" should be interpreted as being inclusive without exclusivity. Likewise, terms "comprising", "including" and "or" should be interpreted as being inclusive, unless this interpretation is forbidden definitely herein. Where the term "example" is used herein and especially modifies a set of terms, the statement is only illustrative and explanatory and should in no way be considered to be exclusive or universal.

Further aspects and scopes with respect to adaptability may be apparent from the description provided herein. It should be understood that aspects of the present application may be applied individually or in any combination. It also should be understood that the description and particular embodiments herein are only intended to be illustrative rather than to limit the scope claimed by the present application.

Though a number of embodiments have been described above in details, various modifications and variations can be made to some embodiments of the present disclosure by those skilled in the art without departing from the spirit and scope of the present disclosure The scope claimed by the present disclosure should be limited by the accompanying claims.

What is claimed is:

1. An array substrate comprising a plurality of shift register units, a plurality of gate lines and a plurality of data lines crossing the plurality of gate lines, wherein
the plurality of gate lines crossing the plurality of data lines defines a plurality of pixel regions;
each of the pixel regions is divided into a driving zone and a pixel unit zone; and
a plurality of the driving zones in a same column constitute at least one unit region and each of the shift register units is disposed in one of the at least one unit region to provide scanning signals to a respective one of the gate lines that is connected to said shift register unit.

2. The array substrate of claim 1, wherein the area of a driving zone is smaller than that of a pixel unit zone.

3. The array substrate of claim 1, wherein the plurality of shift register units are disposed in unit regions in different columns.

4. The array substrate of claim 1, wherein at least two of the plurality of shift register units are disposed in different unit regions in a same column.

5. The array substrate of claim 1, wherein each gate line is divided into at least two gate line segments, each of the at least two gate line segments is connected with a shift register unit and controls at least one pixel unit correspondingly, a display area is divided into at least two sub-display-areas in accordance with positions at which the gate line segments are separated from each other, and the shift register units to drive the gate line segments in each of the sub-display-areas are cascaded together to form a shift register.

6. The array substrate of claim 5, wherein initiating signals input to individual shift registers are the same as each other.

7. The array substrate of claim 5, wherein initiating signals input to individual shift registers are different from each other.

8. The array substrate of claim 1, further comprising power lines for supplying power to the shift register units and clock signal lines for providing clock signals to the shift register units, wherein the power lines and the clock signal lines are disposed in two different layers with a resin layer disposed between the two different layers.

9. The array substrate of claim 1, a unit region is configured with at least an area capable of accommodating one or more shift register unit to be disposed therein.

10. The array substrate of claim 1, wherein a pixel includes three sub-pixels and the area of a driving zone is one fourth of that of a pixel region.

11. A display panel comprising the array substrate of claim 1.

12. The array substrate of claim 11, wherein the area of a driving zone is smaller than that of a pixel unit zone.

13. The array substrate of claim 11, wherein the plurality of shift register units are disposed in unit regions in different columns.

14. The array substrate of claim 11, wherein at least two of the plurality of shift register units are disposed in different unit regions in the same column.

15. The array substrate of claim 11, wherein each gate line is divided into at least two gate line segments, each of the at least two gate line segments is connected with a shift register unit and controls at least one pixel unit correspondingly, a display area is divided into at least two sub-display-areas in accordance with positions at which the gate line segments are separated from each other, and the shift register units to drive the gate line segments in each of the sub-display-areas are cascaded together to forma shift register.

16. The array substrate of claim 15, wherein initiating signals input to individual shift registers are the same as each other.

17. The array substrate of claim 15, wherein initiating signals input to individual shift registers are different from each other.

18. The array substrate of claim 11, a unit region is configured with at least an area capable of accommodating one or more shift register unit to be disposed therein.

19. The array substrate of claim 11, wherein a pixel includes three sub-pixels and the area of a driving zone is one fourth of that of a pixel region.

20. A display device comprising the display panel of claim 11.

* * * * *